(12) United States Patent
Zhao et al.

(10) Patent No.: US 12,289,920 B2
(45) Date of Patent: *Apr. 29, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Qiyue Zhao, Suzhou (CN); Yu Shi, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 832 days.

This patent is subject to a terminal disclaimer.

(21) Appl. No.: 17/442,141

(22) PCT Filed: Aug. 11, 2021

(86) PCT No.: PCT/CN2021/112109
§ 371 (c)(1),
(2) Date: Sep. 23, 2021

(87) PCT Pub. No.: WO2022/174562
PCT Pub. Date: Aug. 25, 2022

(65) Prior Publication Data
US 2023/0095367 A1 Mar. 30, 2023

(30) Foreign Application Priority Data
Feb. 19, 2021 (WO) ............... PCT/CN2021/076958

(51) Int. Cl.
*H10D 84/82* (2025.01)
*H10D 84/05* (2025.01)
(52) U.S. Cl.
CPC ............ *H10D 84/82* (2025.01); *H10D 84/05* (2025.01)

(58) Field of Classification Search
CPC .................. H01L 27/085; H01L 21/8252
See application file for complete search history.

(56) References Cited

U.S. PATENT DOCUMENTS

| 11,929,406 B2 * | 3/2024 | Zhao ............... H01L 29/41775 |
| 2005/0051796 A1 | 3/2005 | Parikh et al. |

(Continued)

FOREIGN PATENT DOCUMENTS

| CN | 1950945 | 4/2007 |
| CN | 101410985 | 4/2009 |

(Continued)

OTHER PUBLICATIONS

ISA State Intellectual Property Office of the People's Republic of China, International Search Report Issued in Application No. PCT/CN2021/076958, Nov. 18, 2021, WIPO, 5 pages.

(Continued)

Primary Examiner — Monica D Harrison
Assistant Examiner — Andre C Stevenson
(74) Attorney, Agent, or Firm — JCIPRNET (57) ABSTRACT

A semiconductor device includes a first and a second nitride-based semiconductor layers, a first and a second electrodes, a first and a second gate electrodes, a first and a second passivation layers and a conductive layer. The first passivation layer has a first portion covered with a first end portion of the first field plate and a second portion free from coverage of the first field plate. The second passivation layer has a first portion covered by the conductive layer and a second portion free from coverage of the conductive layer. A thickness difference between the first and the second portions of the first passivation layer is less than a thickness difference between the first and the second portions of the second passivation layer.

15 Claims, 9 Drawing Sheets

(56) References Cited

U.S. PATENT DOCUMENTS

| | | |
|---|---|---|
| 2005/0253168 A1 | 11/2005 | Wu et al. |
| 2006/0226442 A1 | 10/2006 | Zhang et al. |
| 2007/0235775 A1 | 10/2007 | Wu et al. |
| 2007/0296085 A1 | 12/2007 | Coolbaugh et al. |
| 2009/0267116 A1 | 10/2009 | Wu et al. |
| 2014/0027782 A1 | 1/2014 | Michael et al. |
| 2014/0061659 A1 | 3/2014 | Teplik et al. |
| 2014/0264453 A1 | 9/2014 | Moens et al. |
| 2015/0109553 A1 | 4/2015 | Kubota |
| 2015/0115458 A1 | 4/2015 | Palm |
| 2015/0357422 A1 | 12/2015 | Liao |
| 2016/0141404 A1 | 5/2016 | Tsai et al. |
| 2018/0331186 A1 | 11/2018 | Srivastava et al. |
| 2021/0111254 A1 | 4/2021 | Jones et al. |
| 2021/0184005 A1* | 6/2021 | Liu ................. H01L 29/402 |

FOREIGN PATENT DOCUMENTS

| | | |
|---|---|---|
| CN | 106684140 | 5/2017 |
| CN | 107068739 | 8/2017 |
| CN | 109659361 | 4/2019 |
| CN | 111261714 | 6/2020 |
| CN | 111509041 | 8/2020 |
| CN | 111613666 | 9/2020 |
| CN | 111682065 | 9/2020 |
| CN | 111697063 A | 9/2020 |
| CN | 111883589 | 11/2020 |
| CN | 111987141 | 11/2020 |
| CN | 112119494 | 12/2020 |
| JP | 2010050147 | 3/2010 |

OTHER PUBLICATIONS

ISA State Intellectual Property Office of the People's Republic of China, Written Opinion of the International Searching Authority Issued in Application No. PCT/CN2021/076958, Nov. 18, 2021, WIPO, 4 pages.

United States Patent and Trademark Office, Restriction Requirement office action, Office Action Issued in U.S. Appl. No. 17/275,680, filed Aug. 14, 2023, 5 pages.

State Intellectual Property Office of the People's Republic of China, First Office Action and Search Report Issued in Application No. 202180001018.1, Dec. 9, 2021, 33 pages. (Submitted with Machine Translation).

State Intellectual Property Office of the People's Republic of China, Second Office Action Issued in Application No. 202180001018.1, Feb. 14, 2022, 10 pages. (Submitted with Machine Translation).

United States Patent and Trademark Office, Non-final office action Issued in U.S. Appl. No. 18/412,609, filed Aug. 21, 2024, 13 pages.

United States Patent and Trademark Office, Restriction Requirement Issued in U.S. Appl. No. 17/275,680, filed Aug. 14, 2023, 05 pages.

International Search Report and Written Opinion of the corresponding PCT application No. PCT/CN2021/112109 mailed on Nov. 17, 2021.

* cited by examiner

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having multiple field plates over the gate electrodes thereof with the morphology controlled.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE DISCLOSURE

In accordance with one aspect of the present disclosure, a semiconductor device is provided. A semiconductor device includes a first nitride-based semiconductor layer, a second nitride-based semiconductor layer, a first electrode and a second S/D electrode, a first gate electrode and a second gate electrode, a first passivation layer, a first field plate, a second passivation layer and a conductive layer. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first electrode and the second S/D electrode are disposed above the second nitride-based semiconductor layer. The first gate electrode and the second gate electrode are disposed above the second nitride-based semiconductor layer and between the first and second electrodes. The first passivation layer is disposed on the second nitride-based semiconductor layer and covers the first and second gate electrodes. The first field plate is disposed over the first gate electrode and over the first passivation layer and has a first end portion directly above the first gate electrode. The first passivation layer has a first portion covered with the first end portion of the first field plate and a second portion free from coverage of the first field plate. The second passivation layer is disposed on the first passivation layer and covers the first field plate. The conductive layer is disposed over the second passivation layer and extends from the first field plate to the second gate electrode and makes contact with a portion of the second nitride-based semiconductor layer. The second passivation layer has a first portion covered by the conductive layer and a second portion free from coverage of the conductive layer. A thickness difference between the first and second portions of the first passivation layer is less than a thickness difference between the first and second portions of the second passivation layer.

In accordance with one aspect of the present disclosure, a semiconductor device is provided. A semiconductor device includes a first nitride-based semiconductor layer, a second nitride-based semiconductor layer, a gate electrode, a first passivation layer, an electrode, a first field plate, a second passivation layer and a second field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The first passivation layer is disposed on the second nitride-based semiconductor layer and covers the gate electrode. The electrode is disposed above the second nitride-based semiconductor layer and penetrates the first passivation layer. The first field plate is disposed on the first passivation layer and extends from a region between the gate electrode and the S/D electrode to a position higher than the gate electrode. The first field plate has an end portion directly above the gate electrode. The first passivation layer has a first portion and a second portion directly above the gate electrode and connected to each other. The first portion is covered with the end portion, and the second portion is free from the coverage of the end portion. The first and second portions have the same level of height with respect to the second nitride-based semiconductor layer. The second passivation layer is disposed on the first passivation layer and covers the first field plate. The second field plate is disposed over the second passivation layer and extends above the first and second portions of the first passivation layer. The second field plate is thicker than the first field plate.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A gate electrode is formed over the second nitride-based semiconductor layer. A first passivation layer is formed on the second nitride-based semiconductor layer to cover the gate electrode. A blanket field plate is formed on the first passivation layer. The blanket field plate is patterned to form a first field plate above the gate electrode using a wet etching process. A second passivation layer is formed on the first passivation layer to cover the first field plate. A blanket conductive layer is formed on the second passivation layer and overlaps with the first field plate and the gate electrode. The blanket conductive layer is patterned by using a dry etching process, so as to form a second field plate above the first field plate and form an electrode in contact with the second nitride-based semiconductor layer.

By the above configuration, since the thickness difference between the first and second portions of the first passivation layer would be zero or approximately zero, the element layers formed above the first passivation layer can be positioned to comply with the device design, thereby avoiding degradation in the performance of the semiconductor device.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1A:
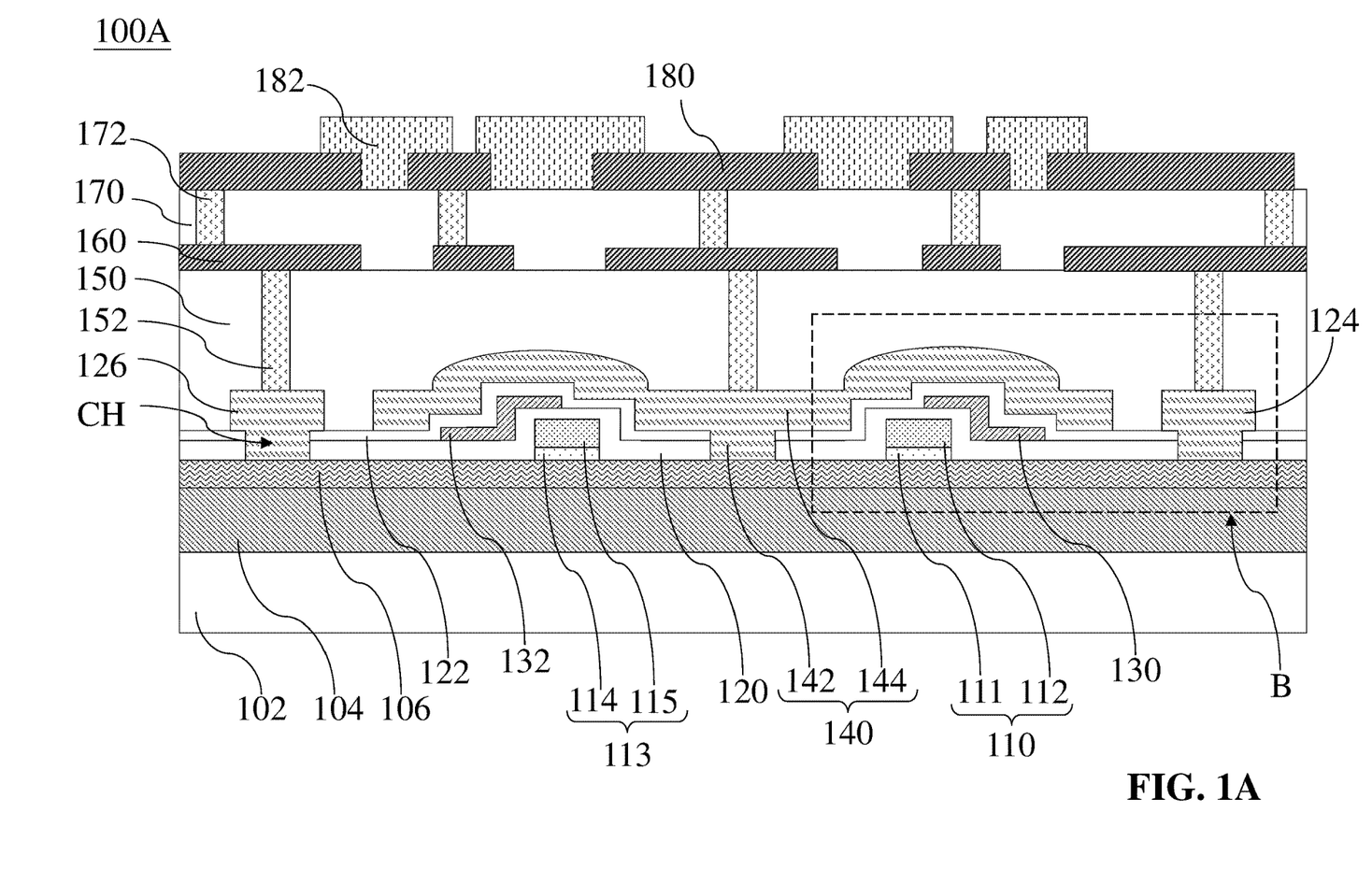
FIG. 1A is vertical cross-sectional view of a semiconductor device according to some embodiments of the present disclosure.

FIG. 1A is a vertical cross-sectional view of a semiconductor device 100A according to some embodiments of the present disclosure. The semiconductor device 100A adopts a double-gate design and a double-field plate design. The double field plates are separated from each other and correspond to the double gates, respectively. Herein, the double-field plate design includes two field plates positioned at the same height.

The semiconductor device 100A includes a substrate 102, nitride-based semiconductor layers 104 and 106, gate structures 110 and 113, passivation layers 120 and 122, electrodes 124 and 126, field plates 130 and 132, a conductive layer 140, passivation layers 150 and 170, conductive vias 152 and 172, patterned conductive layers 160 and 180, and a protection layer 182. More structural details of the semiconductor device 100A are provided as follows.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof. In some embodiments, the material of the substrate 102 can include a silicon substrate with a <111> orientation.

The nitride-based semiconductor layer 104 is disposed on/over/above the substrate 102. The nitride-based semiconductor layer 106 is disposed on/over/above the nitride-based semiconductor layer 104. The exemplary materials of the nitride-based semiconductor layer 104 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 100A includes at least one GaN-based high-electron-mobility transistor (HEMT).

In some embodiments, the semiconductor device 100A may further include a buffer layer, a nucleation layer, or a combination thereof (not illustrated). The buffer layer can be disposed between the substrate 102 and the nitride-based semiconductor layer 110. The buffer layer can be configured to reduce lattice and thermal mismatches between the substrate 102 and the nitride-based semiconductor layer 110, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof. The nucleation layer may be formed between the substrate 102 and the buffer layer. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The gate structures 110 and 113 are disposed on/over/above the nitride-based semiconductor layer 106. The gate structures 110 and 113 are located at different positions of a top surface of the nitride-based semiconductor layer 106. The gate structure 110 includes a doped nitride-based semiconductor layer 111 and a gate electrode 112. The doped nitride-based semiconductor layer 111 is disposed/sandwiched between the nitride-based semiconductor layer 106 and the gate electrode 112. The gate electrode 112 is disposed on/over/above and in contact with the doped nitride-based semiconductor layer 111. A width of the doped nitride-based semiconductor layer 111 is substantially the same as a width of the gate electrode 112. In some embodiments, a width of doped nitride-based semiconductor layer 111 can be greater than that of the gate electrode 112. The profiles of the doped nitride-based semiconductor layer 111 and the gate electrode 112 are the same. For example, both the doped nitride-based semiconductor layer 111 and the gate electrode 112 have rectangular profiles. In other embodiments, the profiles of the doped nitride-based semiconductor layer 111 and the gate electrode 112 can be different from each other. For example, the profile of the doped nitride-based semiconductor layer 111 can be a trapezoid profile in cross-section, and the profile of the gate electrode 112 can be a rectangular profile in cross-section. The gate structure 113 includes a doped nitride-based semiconductor layer 114 and a gate electrode 115. The configuration of the gate structure 110 can be applied to that of the gate structure 113.

In the exemplary illustration of FIG. 1A, the semiconductor device 100A is an enhancement mode device, which is in a normally-off state when the gate electrodes 112 and 115 are at approximately zero bias. Specifically, the doped nitride-based semiconductor layers 111 and 114 may create at least one p-n junction with the nitride-based semiconductor layer 106 to deplete the 2DEG region, such that zones of the 2DEG region corresponding to positions below the corresponding the gate electrodes 112 and 115 have different characteristics (e.g., different electron concentrations) than the rest of the 2DEG region and thus is blocked. Due to this mechanism, the semiconductor device 100A has a normally-off characteristic. In other words, when no voltage is applied to the gate electrodes 112 and 115 or a voltage applied to the gate electrodes 112 and 115 is less than a threshold voltage (i.e., a minimum voltage required to form an inversion layer below the gate electrode 112), the zones of the 2DEG region below the gate electrodes 112 and 115 is kept blocked, and thus no current flows therethrough.

In some embodiments, the doped nitride-based semiconductor layers 111 and 114 can be omitted, such that the semiconductor device 100A is a depletion-mode device, which means the semiconductor device 100A in a normally-on state at zero gate-source voltage.

The doped nitride-based semiconductor layers 111 and 114 can be p-type doped III-V semiconductor layers. The exemplary materials of the doped nitride-based semiconductor layer 111 and 113 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 104 includes undoped GaN and the nitride-based semiconductor layer 106 includes AlGaN, and the doped nitride-based semiconductor layers 111 and 114 are p-type GaN layers which can bend the underlying band structure upwards and deplete the corresponding zones of the 2DEG region, so as to place the semiconductor device 100A into an off-state condition.

The exemplary materials of the gate electrodes 113 and 114 may include metals or metal compounds. The gate electrodes 113 and 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The passivation layer 120 can be disposed on/over/above the nitride-based semiconductor layer 106 and the gate structure 110 and 111. The passivation layer 120 covers the gate electrode 112 and 115. The passivation layer 122 can be disposed on/over/above the passivation layer 120. The passivation layers 120 and 122 commonly include a plurality of contact holes CH. The passivation layer 120 can be conformal with the gate structure 110 and 111, so as to form protruding portions above the nitride-based semiconductor layer 106. Each of the protruding portions of the passivation layer 120 can cover the corresponding one of the gate electrodes 112 and 115. The material of the passivation layers 120 and 122 can include, for example but is not limited to, dielectric materials. For example, the passivation layers 120 and 122 can include $SiN_x$ (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

In some embodiments, the electrode 124 can serve as a source electrode. In some embodiments, the electrode 124 can serve as a drain. In some embodiments, the electrode 126 can serve as a source electrode. In some embodiments, the electrode 126 can serve as a drain. The role of the electrodes 124 and 126 depends on the device design.

The electrodes 124 and 126 are disposed on/over/above the nitride-based semiconductor layer 106. The electrodes 124 and 126 are in contact with the nitride-based semiconductor layer 106. The electrodes 124 and 126 can extend through the contact holes CH of the passivation layers 120 and 122 to make contact with the nitride-based semiconductor layer 106. Each of the electrodes 124 and 126 can penetrate the passivation layers 120 and 122 through the contact holes CH.

The gate structures 110 and 113 are located between the electrodes 124 and 126. In some embodiments, other configurations may be used, particularly when plural source, drain, or gate electrodes are employed in the device. In the exemplary illustration of FIG. 1A, a distance between the gate electrode 115 to the S/D electrode 124 is substantially the same as a distance between the gate electrode 112 to the S/D electrode 126. In some embodiments, the distance between the gate electrode 115 to the S/D electrode 124 can be greater than the distance between the gate electrode 112 to the S/D electrode 126 depending on different electrical properties requirements. In some embodiments, the distance between the gate electrode 115 to the S/D electrode 124 can be less than the distance between the gate electrode 112 to the S/D electrode 126 depending on different electrical properties requirements.

In some embodiments, the electrodes 124 and 126 can include, for example but are not limited to, metals, alloys, doped semiconductor materials (such as doped crystalline silicon), compounds such as silicides and nitrides, other conductor materials, or combinations thereof. The exemplary materials of the electrodes 124 and 126 can include, for example but are not limited to, Ti, AlSi, TiN, or combinations thereof. The electrodes 124 and 126 may be a single layer, or plural layers of the same or different composition. In some embodiments, the electrodes 124 and 126 form ohmic contacts with the nitride-based semiconductor layer 106. The ohmic contacts can be achieved by applying Ti, Al, or other suitable materials to the electrodes 124 and 126. In some embodiments, each of the electrodes 124 and 126 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The field plates 130 and 132 are disposed on/over/above the passivation layer 120. The field plates 130 and 132 are in contact with the passivation layer 120. The field plates 130 and 132 are conformal with the passivation layer 120. The passivation layer 122 covers the field plates 130 and 132. Each of the field plates 130 and 132 is disposed/sandwiched/embedded between the passivation layers 120 and 122. The passivation layer 122 is conformal with a profile constructed collectively by the field plates 130 and 132 and the passivation layer 120.

The field plate 130 is positioned between the S/D electrode 124 and the gate structure 110 (i.e., between the S/D electrode 124 and the gate electrode 112). The field plate 132 is positioned between the S/D electrode 126 and the gate structure 113 (i.e., between the S/D electrode 126 and the gate electrode 115). The field plates 130 and 132 are disposed on/over/above the gate electrodes 112 and 115, respectively. More specifically, the field plate 130 extends from a region between the gate electrode 112 and the S/D electrode 124 to a position higher than the gate electrode 112. The field plate 132 extends from a region between the gate electrode 115 and the S/D electrode 126 to a position higher than the gate electrode 115.

The exemplary material of the field plates 130 and 132 can include, for example but are not limited to, conductive materials, such as Ti, Ta, TiN, TaN, or combinations thereof. In some embodiments, other conductive materials such as Al, Cu, doped Si, and alloys including these materials may also be used. The passivation layers 120 and 122 and the field plates 130, 132 and 140 can be alternatively stacked/disposed on/above/over the nitride-based semiconductor layer 106. The exemplary material of the field plates 130, 132 and 140 can include, for example but are not limited to, conductive materials, such as Ti, Ta, TiN, TaN, or combinations thereof. In some embodiments, other conductive materials such as Al, Cu, doped Si, and alloys including these materials may also be used. Since the field plates 130, 132 and 140 are made of conductive materials, the field plates 130, 132 and 140 can be referred to as conductive layers. In some embodiments, the field plates 130, 132 and 140 are made of the same conductive material, for example, TiN, such that they can be made together in one manufacturing stage. In some embodiments, the materials of the passivation layer 120 and the field plates 130 can be selected such that they have different etching rates with respect to the same etchant.

The conductive layer 140 is disposed on/over/above the passivation layer 122. The conductive layer 140 is in contact with the passivation layer 122. The conductive layer 140 is conformal with a profile constructed by the passivation layer 122. The conductive layer 140 can extend laterally on/over/above the passivation layers 120 and 122. For example, the conductive layer 140 can extend from the field plate 130 to the gate electrode 115. The conductive layer 140 can further extend to the field plate 132.

The horizontal extending length of the conductive layer 140 is longer than a maximum distance from the field plate 130 to the field plate 132. Therefore, the vertical/orthogonal projections of the field plates 130 and 132 on the nitride-based semiconductor layer 106 is inside a vertical/orthogonal projection of the conductive layer 140 on the nitride-based semiconductor layer 106.

The conductive layer 140 is spaced apart from the S/D electrode 124 as well as the S/D electrode 126. In some embodiments, the conductive layer 140 and the electrodes 124 and 126 include the same conductive material. The conductive layer 140 has an end surface located between the S/D electrode 124 and the field plate 130 and another end surface located between the S/D electrode 126 and the field plate 132. The end surfaces of the conductive layer 140 are opposite each other. In this regard, the horizontal extending length can be defined as being a distance between two opposite end surfaces of the conductive layer 140.

The conductive layer has a contact portion 142 and a field plate portion 144. The contact portion 142 is located between the gate electrodes 112 and 115. The contact portion 142 can penetrate the passivation layers 120 and 122 to make contact with the nitride-based semiconductor layer 106. In some embodiment, the contact portion 142 can serve as a source electrode. In some embodiment, the contact portion 142 can serve as a drain electrode. The gate electrodes 112 and 115, the electrodes 124 and 126, and the contact portion 142 of the conductive layer 140 can collectively act as at least one nitride-based/GaN-based HEMT with the 2DEG region, which can be called a nitride-based/GaN-based semiconductor device.

The field plate portion 144 can laterally span across the field plates 130 and 132 and the gate electrodes 112 and 115. The field plate portion 144 can extends from a left side of the gate electrode 115 and the field plate 132 to a right side thereof (i.e., opposite the left side). The field plate portion 144 can extend from a left side of the gate electrode 115 and the field plate 132 to a right side of the gate electrode 112 and the field plate 130. The field plate portion 144 can have a curved border/boundary, which is advantageous to achieve a desirable stress distribution inside the semiconductor device 100A. The field plate portion 144 is thicker than the field plates 130 and 132.

In order to avoid the breakdown phenomenon induced by strong peak electric field near the gate edge which limits the device performance, one approach to lower the peak of the electric field is to utilize multiple field plates to split the electric field into more peaks so as to achieve a more uniform electric field distribution. The field plates 130 and 132 and the field plate portion 144 can collectively change an electric field distribution in the semiconductor device 100 and affect breakdown voltage thereof. To achieve it, the vertical/orthogonal projections of the field plates 130 and 132 on the nitride-based semiconductor layer 106 is inside a vertical/orthogonal projection of the field plate portion 144, thereby effectively providing modulation for change a distribution of the electric field.

Figure 1B:
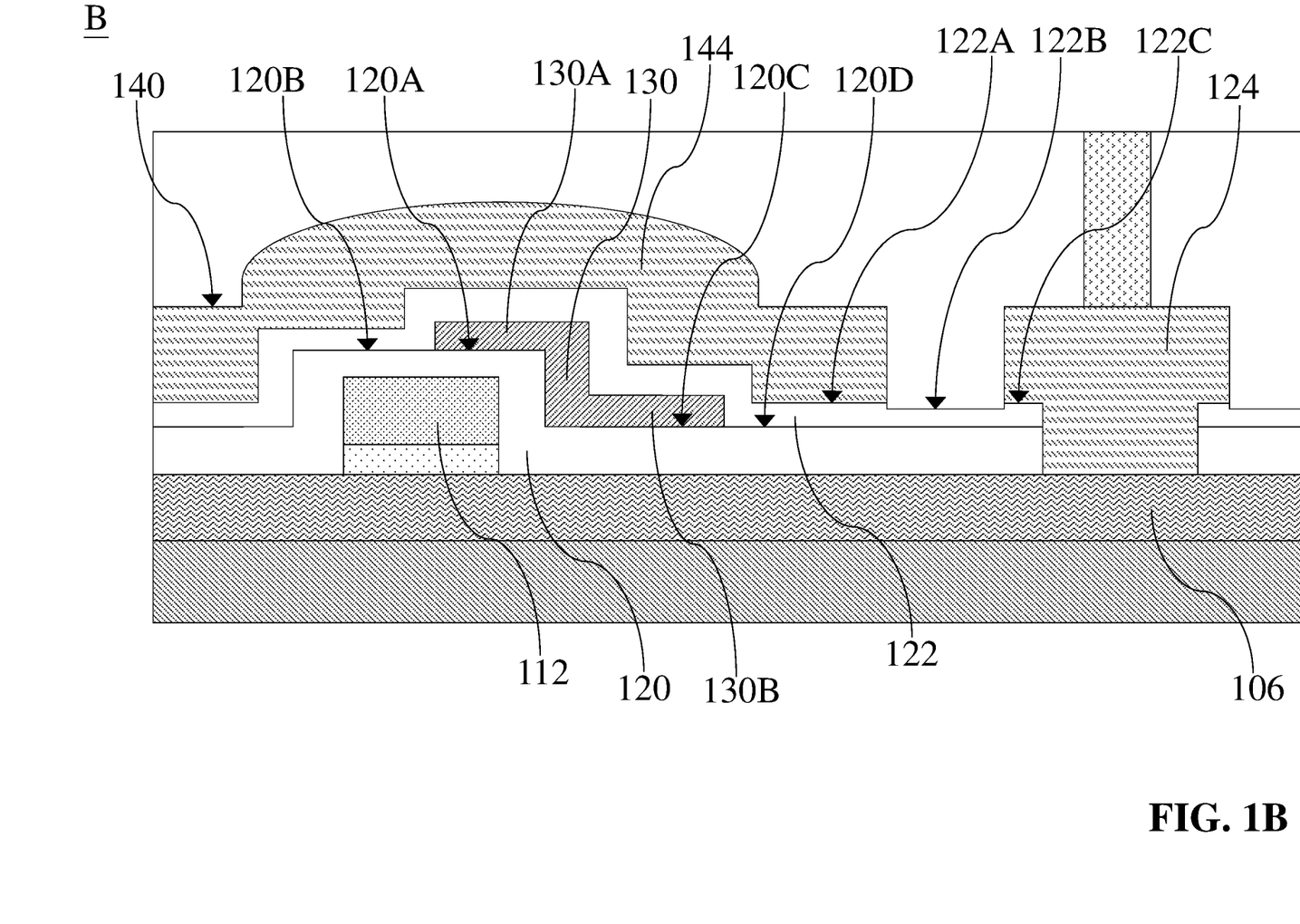
FIG. 1B is an enlarged vertical cross-sectional view of a region B in FIG. 1A.

In order to make the field plates 130 and 132 and the field plate portion 144 collectively change the electric field distribution, the morphology beneath the field plates 130 and 132 and the field plate portion 144 needs to be controlled. To illustrate, FIG. 1B is an enlarged vertical cross-sectional view of a region B in the FIG. 1A. Although the following description is made with respect to the field plate 130, it can be applied to the field plate 132.

The field plate 130 includes two end portions 130A and 130B. The end portion 130A is disposed on the protruding portion of the passivation layer 120, such that the end portion 130A of the field plate 130 is directly disposed above the gate electrode 112. The end portion 130B is opposite the end portion 130A. The end portion 130B is in a position lower than the end portion 130A. In some embodiments, in order to achieve a better stress distribution, at least one of the end portions 130A and 130B can have a curved sidewall.

The passivation layer 120 has portions 120A, 120B, 120C, and 120D. The portion 120A is covered with the end portion 130A of the field plate 130. The portion 120A connects to (or abuts against) the portion 120B. The portion 120B is free from coverage of the field plate 130. The portion 120C is covered by the end portion 130B of the field plate 130. The portion 120D is free from coverage of the field plate 130. The portion 120D connects to (or abuts against) the portion 120C.

The conductive layer 140 is disposed on/over/above the passivation layer 122. The conductive layer 140 is in contact with the passivation layer 122. The passivation layer 122 has portions 122A, 122B and 122C. The portion 122A is covered by the conductive layer 140. The portion 122B is free from coverage of the conductive layer 140. The portion 122C is covered with the S/D electrode 124. The portion 122B connects (or abuts against) the portions 122A and 122C and is located between the portions 122A and 122C.

It should be noted that the manufacturing process for forming the field plates 130 and 132 can be different from that of the conductive layer 140, which is advantageous to the improvement in the electrical characteristic of the semiconductor device 100A. The different manufacturing processes make a difference in the surface morphology of the underlying passivation layers 120 and 122. One of the reasons is that such an approach can avoid the semiconductor device 100A having a configuration deviating from the original design.

For example, with respect to a semiconductor device including a stack structure that is formed by a bottom passivation layer, a bottom field plate, a top passivation layer, and a top field plate. The formation of the bottom field plate may include patterning a blanket conductive layer to form the bottom field plate, in which the patterning process includes a dry etching process. However, some portion of the bottom passivation layer would be removed (e.g., the portion of the bottom passivation layer which is free from coverage of the bottom field plate), resulting in a reduced thickness of afore-mentioned portion of the bottom passivation layer. In other words, the top surface of the bottom passivation layer can be uneven due to the dry etching process. Accordingly, the element layers higher than the bottom passivation layer, such as the top passivation layer and the top field plate on the bottom passivation layer, would be formed at a position lower than the original design position due to the reduced thickness of the bottom passivation layer. That is to say, the height parameters of the element layers higher than the bottom passivation layer are uncontrollable. As such, the poor surface flatness of the bottom passivation layer can negatively impact the stability and performance of the semiconductor device.

Regarding at least one difference between the processes for forming the field plate 130 and the conductive layer 140, they are patterned by different approaches. The patterning of the field plate 130 can be achieved by using a wet etching process, and the patterning of the conductive layer 140 can be achieved by using a dry etching process. In this regard, a chemical process of the wet etching can provide a high etch selectivity. The high etch selectivity means that the etch rate is stronger with respect to the target material but weaker with respect to the non-target material. In contrast, dry etching has a drawback of low selectivity. One of the reasons for using dry etching for patterning the conductive layer 140 is that dry etching involves ion bombardment, such as reactive-ion etching (RIE), and features fast etching and is controllable with respect to the target material. Although dry etching has a low selectivity, the tradeoff between the low selectivity and above advantages can provide a positive effect for the conductive layer 140 due to its great thickness.

In this regard, during the patterning of field plate 130, the portion 120B of the passivation layer 120 can be free from wet etching process because of having a much lower etching rate than that of the field plate 130, and thus the morphological profile thereof would be retained. As such, after patterning the field plate 130, the thickness of the portion 120B of the passivation layer 120 can be kept the same or almost the same (i.e., the reduced quantity is negligible). On the other hand, during patterning of the conductive layer 140, the passivation layer 122 (e.g., the portion 122B thereof) is etched as it is exposed from the conductive layer 140. It is called over-etching, which would change the morphological profile thereof. As such, after patterning of conductive layer 140, the thickness of the portion 122B of the passivation layer 122 is significantly reduced. Therefore, a significant/non-zero height difference is created. Explained in another way, the top surfaces of the portions 122A, 122B, and 122C may have the different level of heights with respect to the nitride-based semiconductor layer 106.

Although the over-etching occurs at some positions of the passivation layer 122, the vertical locations of the field plate 130 and 140 have been constructed such that over-etching would not significantly affect the performance of the semiconductor device 100A. However, since the dry etching for patterning the conductive layer 140 has the favorable controllability, the efficiency of the process for manufacturing the semiconductor device 100A can be increased (e.g., speeding up the manufacturing process).

As such, the difference between wet and dry etching processes creates a surface morphology of the passivation layer 120 differing from that of the passivation layer 120. The height difference of the portions 120A and 120B is zero or approximately zero. The top surfaces of the two portions 120A and 120B are substantially coplanar. Explained in another way, the top surfaces of the portions 120A and 120B have the same level of height with respect to the nitride-based semiconductor layer 106. Similarly, the height difference of the portions 120C and 120D is zero or approximately zero. Regarding the conductive layer 140, after the formation thereof, a thickness difference between the portions 122A and 122B of the passivation layer 122 is significantly greater than zero. A thickness difference between the portions 122B and 122C of the passivation layer 122 is significantly greater than zero as well. Therefore, the thickness difference between the portions 120A and 120B (or between the portions 120C and 120D) of the passivation layer 120 is less than a thickness difference between the portions 122A and 122B (or between the portions 122B and 122C) of the passivation layer 122.

In summary, since the thickness difference between the portions 120A and 120B (or between the portions 120C and 120D) of the passivation layer 120 is zero or approximately zero, after the formation of the field plates 130 and 132, the element layers formed above the passivation layer 120 can be located at a position complying with the device design. It avoids a deleterious impact on the performance of the semiconductor device 100A. On the other hand, although dry etching may cause surface/sidewall defects to the element layers, the trade-off between the production efficiency and the interface defects issue is a net positive gain.

Referring to FIG. 1A again, the passivation layer 150 is disposed on/over/above the passivation layer 122, the electrodes 124 and 126 and the conductive layer 140. The passivation layer 150 covers the passivation layer 122, the electrodes 124 and 126 and the conductive layer 140. The electrodes 124 and 126 and the conductive layer 140 are spaced apart from each other by the passivation layer 150. The passivation layer 150 can serve as a planarization layer which has a level top surface to support other layers/elements. In some embodiments, the passivation layer 150 can be formed as being thicker, and a planarization process, such as a chemical mechanical polish (CMP) process, is performed on the passivation layer 150 to remove the excess portions, thereby forming a level top surface. The exemplary materials of the passivation layer 150 can be identical to or similar to that of the passivation layers 120 and 122.

The conductive vias 152 are disposed within the passivation layer 150. The conductive vias 152 penetrate the passivation layer 150. The conductive vias 152 extend longitudinally to electrically couple with the electrodes 124 and 126 and the conductive layer 140, respectively. The upper surfaces of the conductive vias 152 are free from coverage of the passivation layer 150. The exemplary materials of the conductive vias 152 can include, for example but are not limited to, conductive materials, such as metals or alloys.

The patterned conductive layer 160 is disposed on the passivation layer 150 and the conductive vias 152. The patterned conductive layer 160 is in contact with the conductive vias 152. The patterned conductive layer 160 may have metal lines, pads, traces, or combinations thereof, such that the patterned conductive layer 160 can form at least one circuit. The exemplary materials of the patterned conductive layer 160 can include, for example but are not limited to, conductive materials. The patterned conductive layer 160 may include a single film or multilayered film having Ag, Al, Cu, Mo, Ni, Ti, alloys thereof, oxides thereof, nitrides thereof, or combinations thereof.

The passivation layer 170 is disposed on/over/above the passivation layer 150 and the patterned conductive layer 160. The passivation layer 170 covers the passivation layer 150 and the patterned conductive layer 160. The exemplary materials of the passivation layer 170 can be identical to or similar with that of the passivation layers 120 and 122.

The conductive vias 172 are disposed within the passivation layer 170. The conductive vias 172 penetrate the passivation layer 170. The conductive vias 172 extend longitudinally to electrically couple with the patterned conductive layer 160. The upper surfaces of the conductive vias 172 are free from coverage of the passivation layer 170. The exemplary materials of the conductive vias 172 can be identical to or similar to that of the conductive vias 152.

The patterned conductive layer 180 is disposed on the passivation layer 170 and the conductive vias 172. The patterned conductive layer 180 is in contact with the conductive vias 172. The patterned conductive layer 180 may have metal lines, pads, traces, or combinations thereof, such that the patterned conductive layer 180 can form at least one circuit. The exemplary materials of the patterned conductive layer 180 can be identical to or similar with that of the patterned conductive layer 160.

The protection layer 182 is disposed above the passivation layer 170 and the patterned conductive layer 180. The protection layer 182 covers the passivation layer 170 and the patterned conductive layer 180. The protection layer 182 can prevent the patterned conductive layer 180 from oxidizing. Some portions of the patterned conductive layer 180 can be exposed through openings in the protection layer 182, which are configured to electrically connect to external elements (e.g., an external circuit).

Although the conductive layer 140 is disposed over the gate electrodes 112 and 115 and the field plates 130 and 132, the connection to the gate electrodes 112 and 115 and the field plates 130 and 132 can be maintained. For example, FIGS. 1C and 1D are different vertical cross-sectional views of the semiconductor device 100A in FIG. 1A.

Figure 1C:
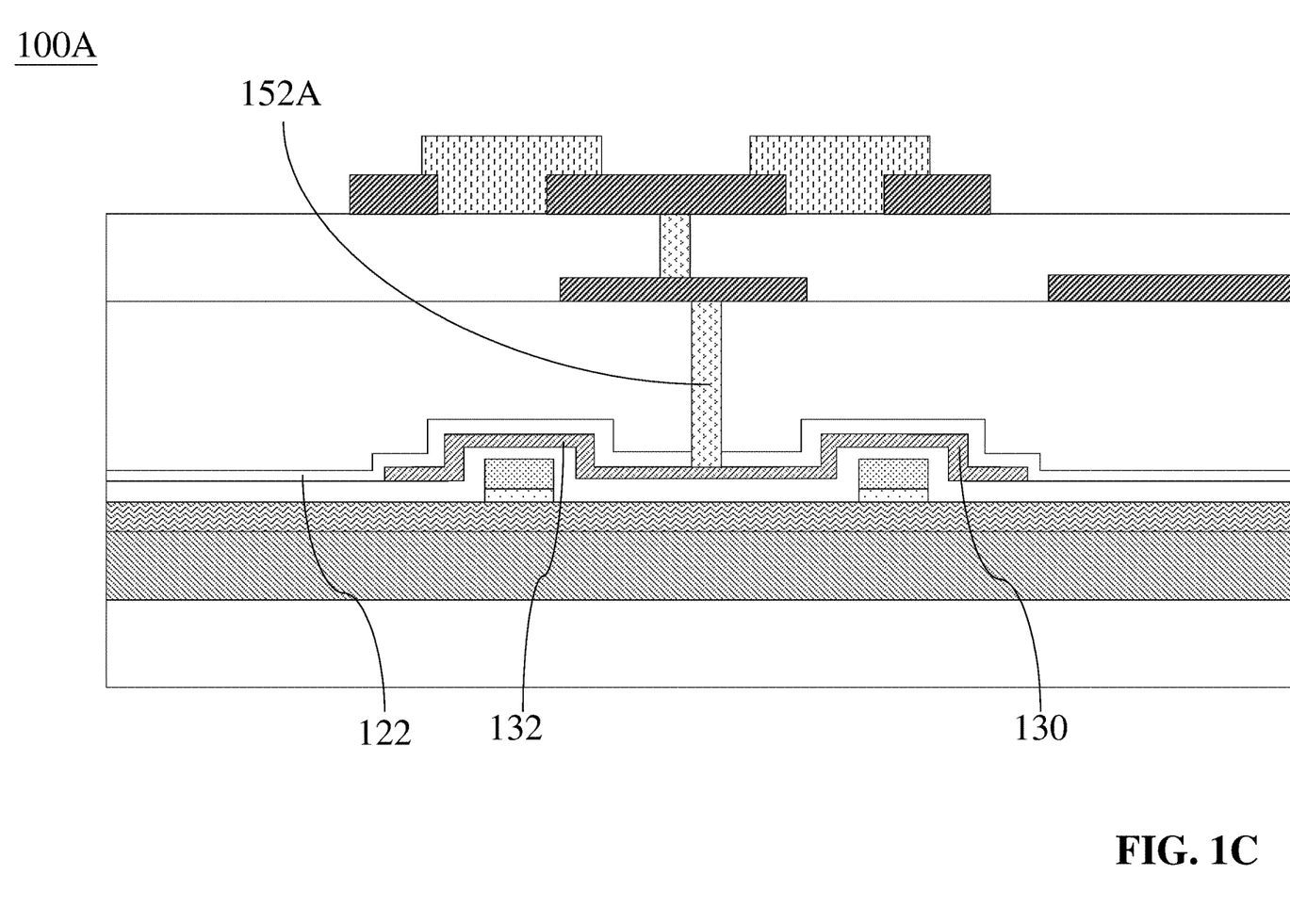
FIGS. 1C and 1D are different vertical cross-sectional views of the semiconductor device in FIG. 1A.

Referring to FIG. 1C, portions of the field plates 130 and 132 are physically connected to each other without the converge of the conductive layer 140 (see FIG. 1B). Therefore, the contact via 152A can penetrate the passivation layer 122 to make contact with the field plate 130 or 132 but without penetrating the conductive layer 140.

Figure 1D:
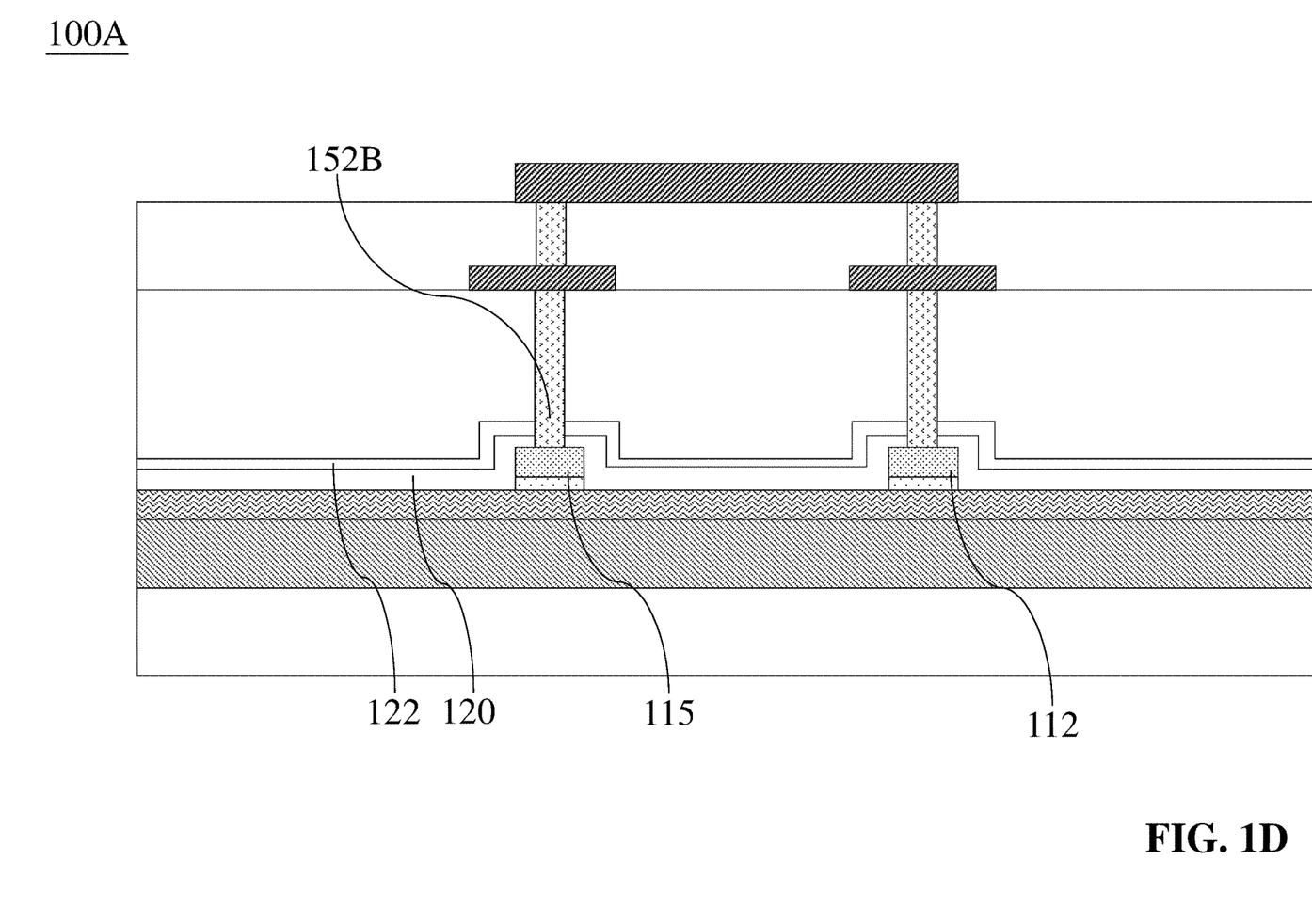

Referring to FIG. 1D, the gate electrodes 112 and 115 have portions that are not located beneath the conductive layer 140 and the field plates 130 and 132 (see FIG. 1B). Therefore, the contact via 152B can penetrate the passivation layers 120 and 122 to make contact with gate electrodes 112 and 115 but without penetrating the conductive layer 140 and the field plates 130 and 132.

Different stages of a method for manufacturing the semiconductor device 100A are shown in FIG. 2A, FIG. 2B, FIG. 2C, FIG. 2D, FIG. 2E, and FIG. 2F, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
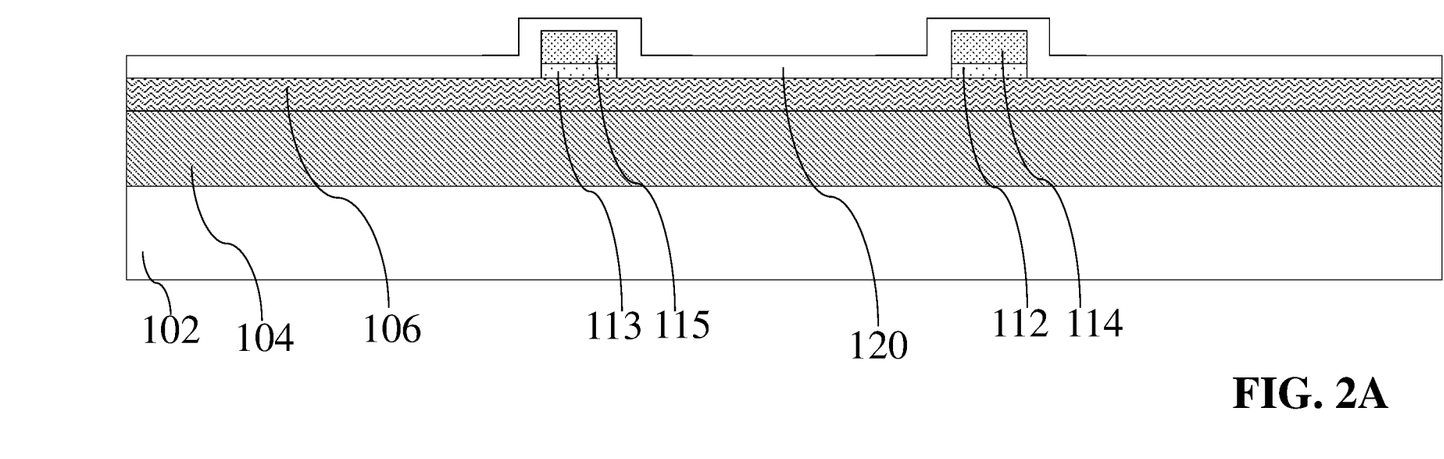
FIG. 2A, FIG. 2B, FIG. 2C, FIG. 2D, FIG. 2E, and FIG. 2F show different stages of a method for manufacturing a nitride-based semiconductor device according to some embodiments of the present disclosure.

Referring to FIG. 2A, nitride-based semiconductor layers 104 and 106 can be formed over the substrate 102 in sequence by using the above-mentioned deposition techniques. Doped nitride-based semiconductor layers 111 and 114 and gate electrodes 112 and 115 are formed on the nitride-based semiconductor layer 106. The formation of the doped nitride-based semiconductor layers 111 and 114 and gate electrodes 112 and 115 includes a patterning process, which can be performed by photolithography, exposure and development, etching, other suitable processes, or combinations thereof. A passivation layer 120 can be formed to cover the of the gate structures 110 and 113 by using the above-mentioned deposition techniques.

Figure 2B:
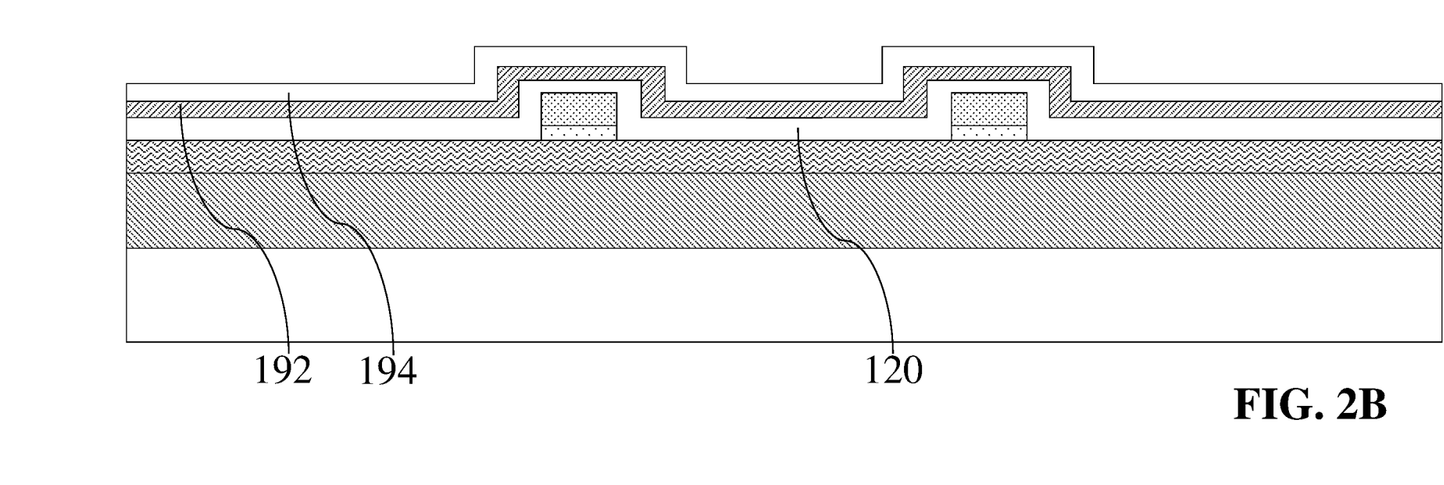

Referring to FIG. 2B, a blanket field plate 192 and a mask layer 194 can be formed above the passivation layer 120 in sequence. In some embodiments, the mask layer 194 is made of $SiO_x$ (e.g., $SiO_2$).

Figure 2C:
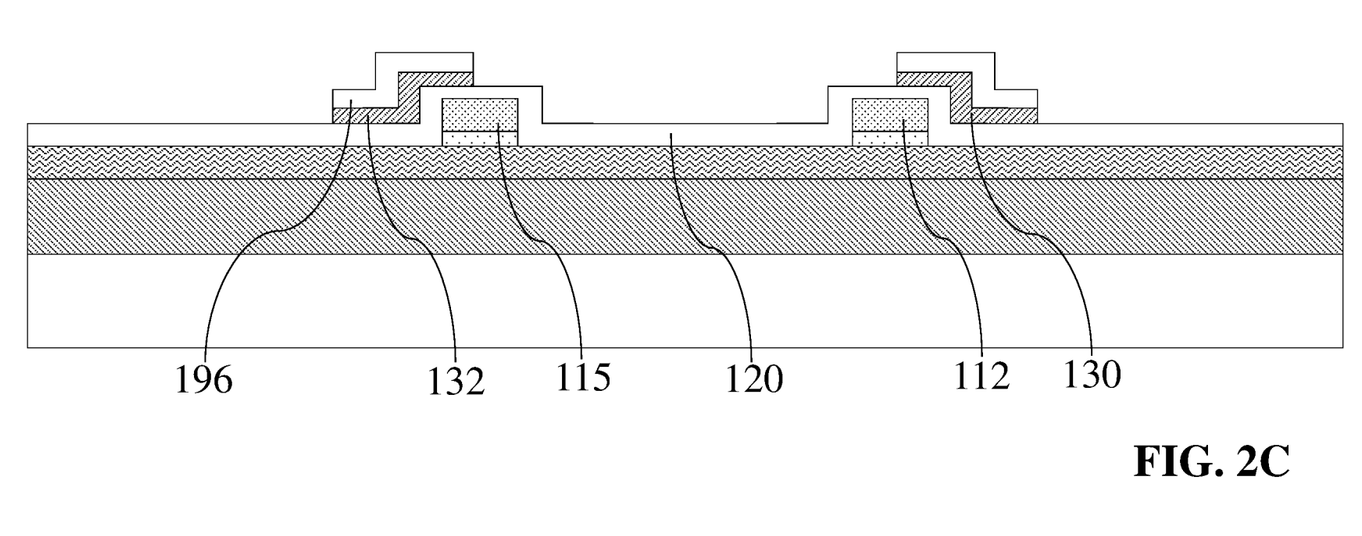

Referring to FIG. 2C, the mask layer 194 is patterned to form a mask layer 196 having openings. Some portions of the blanket field plate 192 are exposed from the openings of the mask layer 196. The profile of the mask layer 196 can be transferred to the blanket field plate 192 by performing a patterning process. The blanket field plate 192 is patterned to form the field plates 130 and 132, such that each of the field plates 130 and 132 has an end portion directly above corresponded the gate electrode 112 or 115.

The patterning process can be performed by a wet etching process. Some portions of the blanket field plate 192 are etched by the wet etching process, so as to form the field plates 130 and 132. As afore-mentioned, the wet etching process can provide a high selectivity, which means that the wet etching process is a selective etching process. Therefore, no over-etching would occur at the intermediate passivation layer 120 and thus the thickness of the intermediate passivation layer 120 can be kept the same or almost the same. In some embodiments, the blanket field plate 192 is made of TiN and the intermediate passivation layer 120 is made of $Si_3N_4$. The etchant applied to the wet etching process can have a higher etching rate with respect to the TiN than that of the $Si_3N_4$.

Figure 2D:
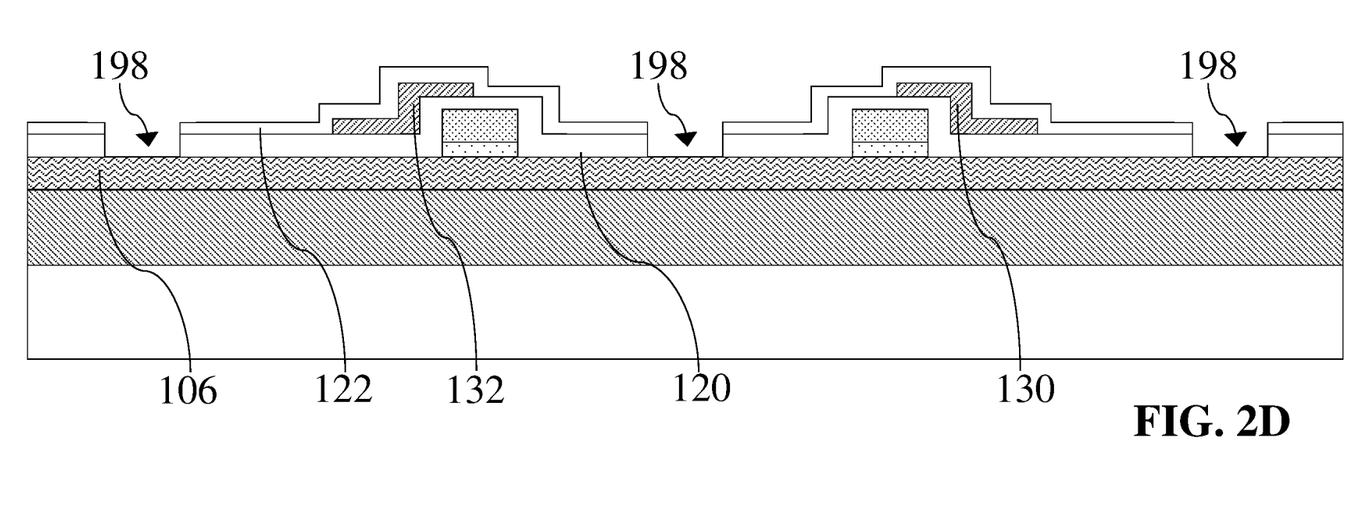

Referring to FIG. 2D, the mask layer 194 is removed. Then, a passivation layer 122 is formed on the passivation layer 120 to cover the field plates 130 and 132. A patterning process can be performed on the passivation layers 120 and 122 to remove some portions thereof, and thus the openings are formed. The locations of the openings are defined as the S/D regions 198. Parts of a top surface of the nitride-based semiconductor layer 106 can be exposed by the openings.

Figure 2E:
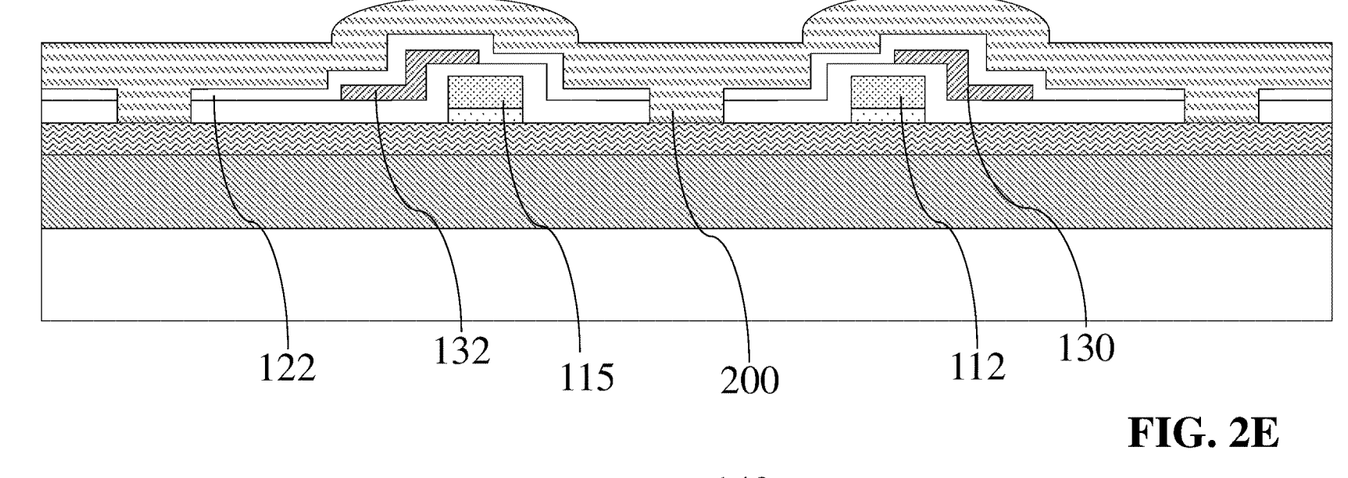

Referring to FIG. 2E, a blanket conductive layer 200 is formed on the passivation layer 122 and overlaps with the field plates 130 and 132 and the gate electrode 112 and 115. The blanket conductive layer 200 is formed with having a thickness greater than that of the field plates 130 and 132. In addition, the blanket conductive layer 200 can be formed into the S/D regions 198, so as to make contact with nitride-based semiconductor layer 106.

Figure 2F:
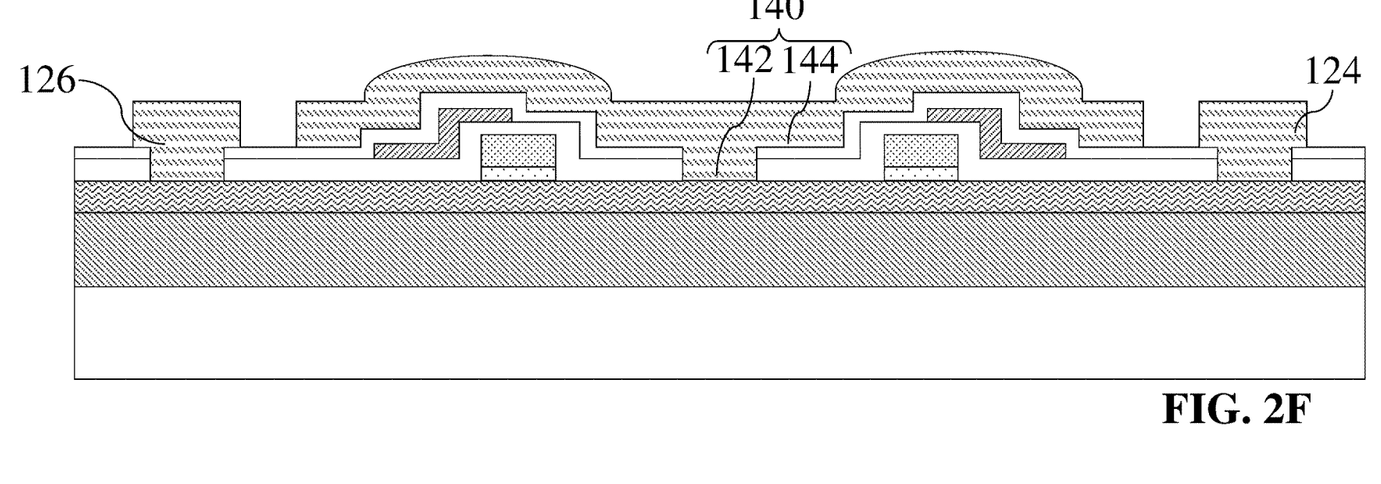

Referring to FIG. 2F, a patterning process can be performed on the blanket conductive layer 200. The patterning process can be performed by using a dry etching process. For example, the dry etching process is a RIE process, which applies high-energy ions from a plasma source to attack some portions of the blanket conductive layer 200 and react with it for removing the same, so as to achieve patterning. After patterning of the blanket conductive layer 200, electrodes 124 and 126 and a conductive layer 140 are formed from the blanket conductive layer 200. That is, patterning of the blanket conductive layer 200 not only can form the electrodes 124 and 126 but also form the conductive layer 140. Therefore, the formation of the electrodes 124 and 126 and the conductive layer 140 can be integrated into one stage. Hence, there is no need to perform another stage to form the electrodes 124 and 126 or the conductive layer 140. The manufacturing process of the semiconductor device 100A can be simplified, and the manufacturing cost thereof can be reduced. Thereafter, passivation layers 150 and 170, conductive vias 152 and 172, patterned circuit layers 160 and 180, and protection layer 182 can be formed, obtaining the configuration of the semiconductor device 100A as shown in FIG. 1B.

Figure 3:
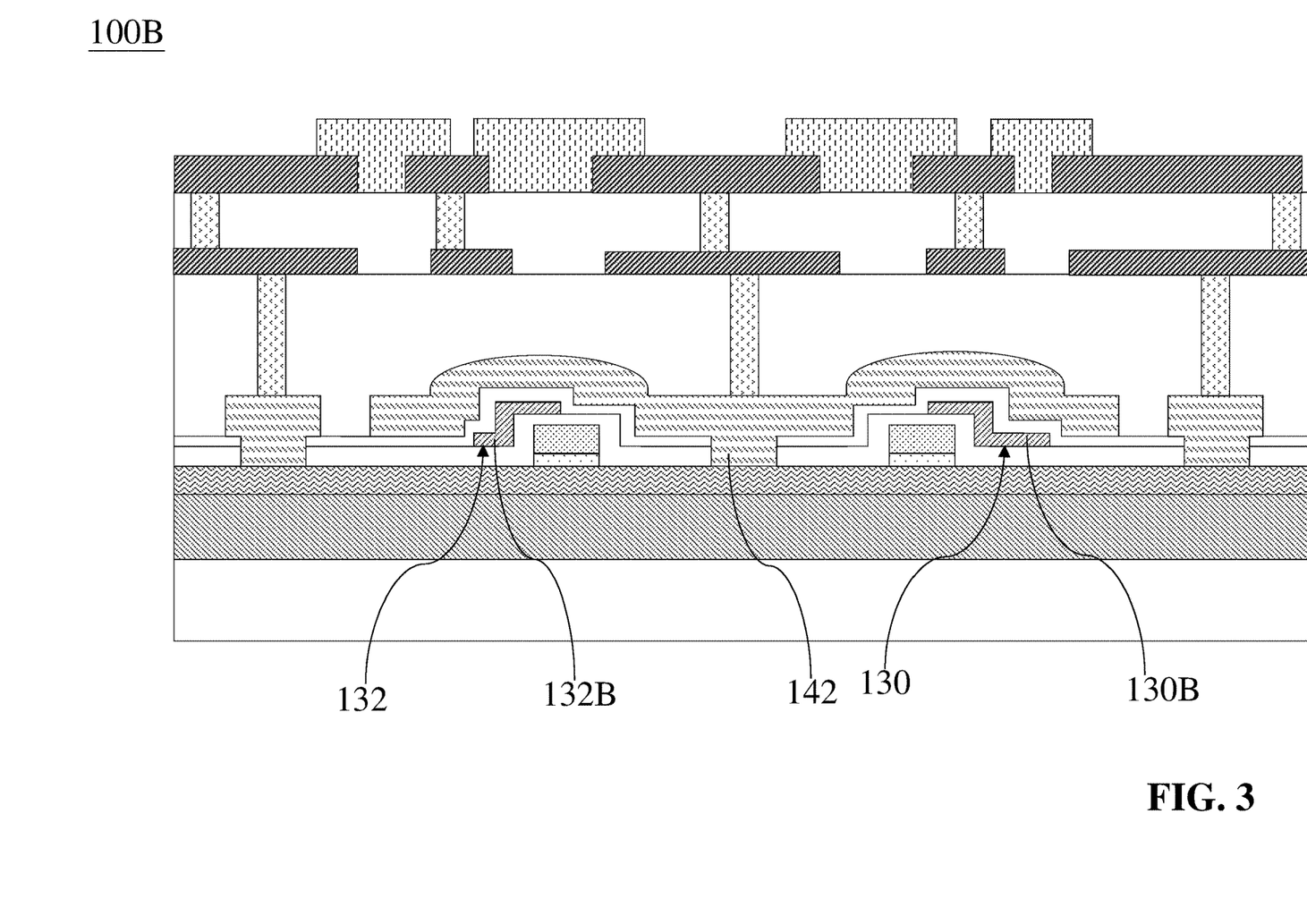
FIG. 3 is a vertical cross-sectional view of a semiconductor device according to some embodiments of the present disclosure.

FIG. 3 is a cross-sectional view of a semiconductor device 100B according to some embodiments of the present disclosure. In the present embodiment, as shown in the exemplary illustration of FIG. 3, two field plates 130 and 132 are asymmetrical about the contact portion 142. Herein, the asymmetry includes asymmetrical profiles. The profile of the field plate 130 can be different from that of the field plate 132. Specifically, the extending length of the bottom end portion 130B is less than that of the bottom end portion 132B of the field plate 132.

Figure 4:
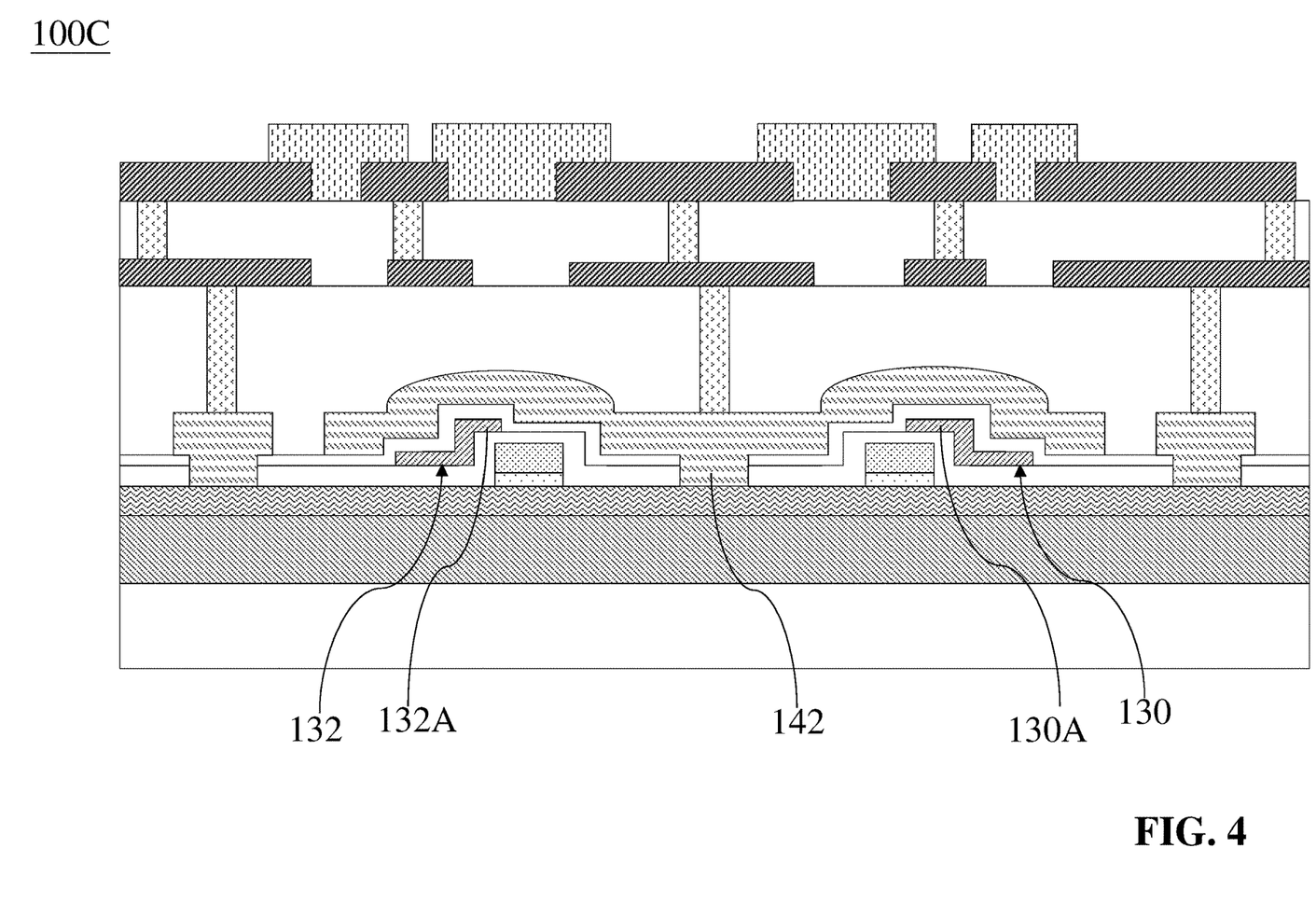
FIG. 4 is a vertical cross-sectional view of a semiconductor device according to some embodiments of the present disclosure.

FIG. 4 is a cross-sectional view of a semiconductor device 100C according to some embodiments of the present disclosure. In the present embodiment, as shown in the exemplary illustration of FIG. 4, two field plates 130 and 132 are asymmetrical about the contact portion 142. Herein, the asymmetry includes asymmetrical profiles. The profile of the field plate 130 can be different from that of the field plate 132. Specifically, the extending length of the top end portion 130A is less than that of the top end portion 132A of the field plate 132

In the semiconductor devices 100C and 100D, the field plates 130 and 132 can be patterned by dry etching process, and thus the field plate design of the present disclosure is flexible, being available to satisfy different device requirements. In some embodiments, the asymmetry can include asymmetrical positions, such that a distance from the field plate 130 to the contact portion 142 differs from a distance from the field plate 132 to the contact portion 142.

Based on the above description, in the present embodiments of the disclosure, the semiconductor device adopts a multi-field-plate structure design so as to achieve a desirable electric field distribution and a better performance.

During the fabrication of the afore-mentioned multi-field-plate structure, the wet and dry etching processes are performed in sequence to form the field plates at different heights. The bottom field plate can be formed by the wetting etching process, such that the passivation layer thereunder can maintain its original designed surface morphology. Hence, the element layers above the bottom field plate will not be deviated from their original designed positions. The top-most field plate, which is thicker than the bottom-most field plate, can be formed by the drying etching process, which is advantageous to its production efficiency. As such, the semiconductor device can have a good reliability, electrical properties and production efficiency.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
   a first nitride-based semiconductor layer disposed above a substrate;
   a second nitride-based semiconductor layer disposed on the first nitride-based semiconductor layer and having a bandgap greater than a bandgap of the first nitride-based semiconductor layer;
   a first electrode and a second S/D electrode disposed above the second nitride-based semiconductor layer;
   a first gate electrode and a second gate electrode disposed above the second nitride-based semiconductor layer and between the first and second electrodes;
   a first passivation layer disposed on the second nitride-based semiconductor layer and covering the first and second gate electrodes;
   a first field plate disposed over the first gate electrode and over the first passivation layer and having a first end portion directly above the first gate electrode, wherein the first passivation layer has a first portion covered with the first end portion of the first field plate and a second portion free from coverage of the first field plate;
   a second passivation layer disposed on the first passivation layer and covering the first field plate; and
   a conductive layer disposed over the second passivation layer and extending from the first field plate to the second gate electrode and making contact with a portion of the second nitride-based semiconductor layer, wherein the second passivation layer has a first portion covered by the conductive layer and a second portion free from coverage of the conductive layer, wherein a thickness difference between the first and second portions of the first passivation layer is less than a thickness difference between the first and second portions of the second passivation layer.

2. The semiconductor device of claim 1, wherein the first field plate has a second end portion in a position lower than the first end portion.

3. The semiconductor device of claim 2, wherein the first passivation layer further has a third portion covered by the second end portion of the first field plate and a fourth portion free from coverage of the first field plate and abutting against the third region of the first passivation layer.

4. The semiconductor device of claim 3, wherein a thickness difference between the third and fourth portions of the first passivation layer is less than the thickness difference between the first and second portions of the second passivation layer.

5. The semiconductor device of claim 1, wherein the conductive layer has a contact portion located between the first and second gate electrodes and penetrating the first and second passivation layers to make contact with the second nitride-based semiconductor layer.

6. The semiconductor device of claim 1, further comprising:
   a second field plate disposed on the second gate electrode and the first passivation layer, wherein the conductive layer has an extending length longer than a distance from the first field plate to the second field plate.

7. The semiconductor device of claim 6, wherein the conductive layer has a first end surface located between the first S/D electrode and the first field plate and a second end surface located between the second S/D electrode and the second field plate, which are opposite each other.

8. The semiconductor device of claim 1, wherein the conductive layer and the first and second S/D electrode comprise the same conductive material.

9. The semiconductor device of claim 1, wherein the second passivation layer further has a third portion covered with the first S/D electrode, and the thickness difference between the first and second portions of the first passivation layer is less than a thickness difference between the second and third portions of the second passivation layer.

10. The semiconductor device of claim 9, wherein the second portion of the second passivation layer connects the first and third portions of the second passivation layer.

11. The semiconductor device of claim 9, wherein the second portion of the second passivation layer abuts against the first and third portions of the second passivation layer.

12. The semiconductor device of claim 1, wherein the first S/D electrode and the conductive layer are spaced apart from each other.

13. The semiconductor device of claim 1, wherein the first field plate includes titanium nitride (TiN).

14. The semiconductor device of claim 1, wherein the second passivation layer is conformal with a profile constructed collectively by the first field plate and the first passivation layer.

15. The semiconductor device of claim 14, wherein the conductive layer is conformal with a profile constructed by the second passivation layer.

* * * * *